(12) United States Patent
Burton et al.

(10) Patent No.: US 6,320,261 B1
(45) Date of Patent: *Nov. 20, 2001

(54) HIGH ASPECT RATIO METALLIZATION STRUCTURES FOR SHALLOW JUNCTION DEVICES, AND METHODS OF FORMING THE SAME

(75) Inventors: Randle D. Burton, Boise, ID (US); John H. Givens, San Antonio, TX (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/063,516

(22) Filed: Apr. 21, 1998

(51) Int. Cl.[7] .......................... H01L 23/48; H01L 23/52; H01L 29/40
(52) U.S. Cl. .......................... 257/754; 250/770; 250/774; 250/382; 250/383; 250/384
(58) Field of Search .................................... 257/754, 757, 257/764, 768, 770, 774, 384, 382, 383; 438/253

(56) References Cited

U.S. PATENT DOCUMENTS

| | | |
|---|---|---|
| 4,394,400 | 7/1983 | Green et al. . |
| 4,481,230 | 11/1984 | Hanak . |
| 4,996,581 | 2/1991 | Hamasaki . |
| 5,079,180 | 1/1992 | Rodder et al. . |
| 5,144,143 | 9/1992 | Raspagliesi et al. . |
| 5,166,770 * | 11/1992 | Tang et al. .......................... 257/770 |
| 5,198,372 | 3/1993 | Verret . |
| 5,232,874 | 8/1993 | Rhodes et al. . |
| 5,240,739 | 8/1993 | Doan et al. . |
| 5,256,245 | 10/1993 | Keller et al. . |
| 5,278,100 | 1/1994 | Doan et al. . |
| 5,409,853 | 4/1995 | Yu . |
| 5,431,794 | 7/1995 | Matsumaru et al. . |
| 5,462,890 | 10/1995 | Hwang et al. . |
| 5,550,078 * | 8/1996 | Sung .................................... 438/253 |
| 5,571,752 | 11/1996 | Chen et al. . |
| 5,796,136 * | 8/1998 | Shinkawata .......................... 257/306 |
| 5,861,344 | 1/1999 | Roberts et al. . |
| 5,985,759 | 11/1999 | Kim et al. . |
| 6,020,254 * | 2/2000 | Taguwa ................................ 438/618 |

OTHER PUBLICATIONS

Mayo, et al. "Across–Wafer Nonuniformity of Long–Throw Sputter Deposition." 43rd National Symposium, Abstracts, Oct. 14–18, 1996.

(List continued on next page.)

Primary Examiner—Sara Crane
Assistant Examiner—Thien F Tran
(74) Attorney, Agent, or Firm—TraskBritt

(57) ABSTRACT

A contact interface having a substantially annular silicide ring along sides of a depression formed in an active surface of the semiconductor substrate, wherein the depression is formed by an etching process to form a contact opening through a dielectric layer. The contact interface is formed by depositing a layer of conductive material, such as titanium, with a high bias power IMP deposition. The conductive material is turned to a silicide by an annealing process, thereby forming the contact interface.

17 Claims, 8 Drawing Sheets

OTHER PUBLICATIONS

IMP Program Team, "Deposition of Ti and TiN using Vectra–IMP Source with Biasable 101 Heater; the Latest in Barrier Liner Technology." Date Unknown.

Hogan, et al., "Tailoring Titanium Silicide Formation through Ionized Metal Plasma Titanium Deposition" (Applied Materials internal publication). Date Unknown.

Dixit, et al., "Ion Metal Plasma (IMP) Titanium Liners for 0.25 and 0.18 μm Multilevel Interconnects," IEDM International Electron Devices Metting, 12/96.

Rossnagle, et al., "Magnetron sputter deposition with high levels of metal ionization." Appl. Phys. Lett. 63 (24), Dec. 13, 1993.

"Applied Materials on CVD roll; chemical vapor deposition products; Product Announcement." Section No. 2146, vol. 42; p. 53, Dec. 9, 1996.

"Applied Materials introduces Endura HP Liner/Barrier systems," M2 Press Wire, Dec. 5, 1996.

"To Fill Deep Device Vias, Ionize Sputtered Materials; Thin Film Technology," Section 13, vol. 38; p. S23, 12/96.

"Applied Materials Launches New Metallization Technology; Vectra Source for Ion Metal Plasma Extends PVD Contact and Via Fill Capability to 0.25 micron and beyond," Business Wire, Jul. 12, 1996.

* cited by examiner

HIGH ASPECT RATIO METALLIZATION STRUCTURES FOR SHALLOW JUNCTION DEVICES, AND METHODS OF FORMING THE SAME

BACKGROUND OF THE INVENTION

1. Field of the Invention

The present invention relates to a contact interface within a contact opening for a shallow junction device, which contact interface is in electrical communication with an active surface of a semiconductor substrate, and methods of forming the same. More particularly, the present invention relates to altering an Ionized Metal Plasma ("IMP") process to form a contact interface having a substantially continuous profile along sides of a depression formed in the active surface of the semiconductor substrate, wherein the depression is formed by an etching process to form a contact opening through a dielectric layer.

2. State of the Art

In the processing of integrated circuits, electrical contact must be made to isolated active-device regions formed within a semiconductor substrate, such a silicon wafer. Such active-device regions may include p-type and n-type source and drain regions used in the production of NMOS, PMOS, and CMOS structures for production of DRAM chips and the like. The active-device regions are connected by conductive paths or lines which are fabricated above an insulative or dielectric material covering a surface of the semiconductor substrate. To provide electrical connection between a conductive path and active-device regions, openings in the insulative material are generally provided to enable a deposited conductive material to contact the desired regions, thereby forming a "contact." The openings in the insulative material are typically referred to as "contact openings."

Higher performance, lower cost, increased miniaturization of components, and greater packaging density of integrated circuits are goals of the computer industry. However, as components become smaller and smaller, tolerances for all semiconductor structures (such as circuitry traces, contacts, and the like) become more and more stringent. In fact, each new generation of semiconductor device technology has seen a reduction in contact size of, on average, about 0.7 times. Unfortunately, interconnect delays have also increased at a rate of about two times per each new generation. Interconnect delays have a limiting effect on clock speeds which lowers performance. Although the reduction in size creates technical problems, the future advancement of the technology requires the capability for forming sub-0.25 $\mu$m contact openings with aspect ratios (height to width) as high as 8 to 1.

Moreover, the reduction in contact size (i.e., diameter) has resulted in intolerable increases in resistance between the active-device regions and the conductive material. Various methods have been employed to reduce the contact resistance at the interface between the conductive material and active-device region. One such method includes the formation of a metal silicide contact interface atop the active-device region within the contact opening prior to the application of the conductive material into the contact opening. A common metal silicide material formed is titanium silicide (TiSi$^x$, wherein x is predominately equal to 2) generated from a deposited layer of titanium.

FIGS. 7–11 illustrate a conventional method of forming a titanium silicide layer on an active-device region. FIG. 7 illustrates an intermediate structure 300 comprising a semiconductor substrate 302 having an active-device region 304 formed therein with a dielectric layer 306 disposed thereover. A contact opening 308 is formed, by any known technique, such as patterning of a photoresist and subsequent etching, in the dielectric layer 306 to expose a portion of the active-device region 304, as shown in FIG. 8. A thin layer of titanium 310 is applied over the dielectric layer 306 and the exposed portion of the active-device region 304, as shown in FIG. 9. A high temperature anneal step is conducted in an inert atmosphere to react the thin titanium layer 310 with the active-device region 304 in contact therewith which forms a titanium silicide layer 312, as shown in FIG. 10. The non-reacted titanium layer 310 may then be removed to result in a final structure 314 with a titanium silicide layer 312 formed therein, as shown in FIG. 11.

Naturally, as contact opening aspect ratios increase, thicker conductive material layers must be deposited, usually by DC magnetron sputtering, to obtain the required amount and depth of conductive material on the active-device region at the bottom of the contact opening. However, with contact openings approaching dimensions of 0.25 $\mu$m in diameter and aspect ratios of greater than 4 to 1, currently utilized processing techniques, such as physical vapor deposition, do not provide adequate step coverage for depositing conductive materials. Even the use of filtering techniques, such as physical collimated deposition and low-pressure long throw techniques, which are used to increase the number of sputtered particles contacting the bottom of the contact opening, have proven ineffective for contact opening diameters less than about 0.35 $\mu$m (for 0.25 $\mu$m diameter contact opening, the deposition efficiency is less than about 15%) and as contact opening aspect ratios increase beyond about 3 to 1 (bottom step coverage of less than 20%). Both collimated deposition and low-pressure long throw techniques also tend to create excessive film buildup at the top corner or rim of the contact opening, causing shadowing of bottom corners of the contact openings. The result is little or no deposited film at the bottom corners of the contact opening and consequently poor step coverage. Although increasing collimator aspect ratio results in improved step coverage, it also reduces deposition rate which reduces product throughput and, in turn, increases the cost of the semiconductor device.

Recently, physical vapor deposition ("PVD") has been revived with the introduction of the Ionized Metal Plasma ("IMP") process. Ionizing sputtered metal particles allows for highly directional PVD for depositing material in contact openings with up to about 6 to 1 aspect ratios and having 0.25 $\mu$m diameter openings. The IMP process can result in up to about 70% bottom coverage and up to about 10% sidewall coverage, even with such high aspect ratios and small diameter contact openings.

As illustrated in FIG. 12, an apparatus 320 used in the IMP process consists of a deposition chamber 322 having a pedestal 324 to support a semiconductor substrate 326 to be coated and a target 328, such as a titanium plate. The pedestal 324 has an RF bias power source 330, the deposition chamber 322 includes an RF power source 332, and the target 328 has an RF or a DC power source 334.

In the IMP process, metal particles (atoms, ions, etc.) (not shown) are sputtered from the target 328. These metal particles pass through a high-density plasma 336 (e.g., usually between about $10^{11}/[cm^3]$ and $10^{12}/[cm^3]$) formed between the target 328 and semiconductor substrate 326 where they become ionized. The ionization of the material particles enables a user to control the angular distribution of material arriving at the substrate for maximum bottom coverage in the bottom of the contact openings (not shown) by the manipulation of the electric field at the substrate.

In the deposition chamber 322, the plasma 336 is maintained by inductively coupling RF energy from the RF power source 332 into the plasma 336. An electric field, or bias voltage, develops in a sheath layer 338 around the plasma 336, accelerating the metal ions (not shown) in a vector substantially perpendicular to the semiconductor substrate 326 by electrostatic coupling. The potential difference between the plasma 336 and the semiconductor substrate 326 can be optionally modulated by applying independent bias power from RF pedestal power bias source 330 to the semiconductor substrate 326.

The degree of ionization of sputtered metal particles depends on their residence time in the plasma 336 (i.e., the longer the residence time, the greater the ionization). The sputtered atoms are ejected from the target 328 with relatively high energies (1 eV to 10 eV), leading to very short residence times. In order to slow down the metal particles for higher ionization, the process is usually operated at relatively high pressure (greater than about 10 mtorr). Such a pressure regime is higher than the 0.5–10 mtorr normally encountered in traditional PVD processes.

One drawback of the IMP process is the uniformity of the thickness of material deposited in the contact opening. When a contact opening is formed, a portion of the active material is also removed, as shown in FIG. 13. Elements common between FIGS. 7–11 and FIGS. 13 and 14 retain the same numeric designation. The uniformity of the IMP process results in a substantially level layer of conductive material 342 at the bottom 344 of the contact opening 308 with very little or no sidewall coverage at the active-device region 304. Thus, when a titanium silicide layer 346 is formed by a high temperature anneal, the titanium silicide layer 346 formed does not effectively take advantage of the sidewall portions 348 which had little or no conductive material 342 thereon (see FIG. 13).

This uniformity is particularly troublesome with shallow junction devices. As semiconductor devices become smaller in lateral dimension, they also become smaller in vertical dimension. Thus, shallow junction formation techniques are used to reduce the depth of the active-device regions of the semiconductor devices. However, for active-device regions having a depth of less than 0.15 microns, a contact depth into the active-device region without current leakage into the underlying substrate requires less than 600 521 of junction penetration for n-type active-device regions and less than about 800 Å for p-type active-device regions. Junction penetration includes both the penetration of the silicide and the depth of active-device region removed during the etching of the contact opening.

FIG. 15 illustrates a contact opening 308 formed to contact a shallow active-device 350. Elements common between FIGS. 13 and 14 and FIGS. 15 and 16 retain the same numeric designation. Again, when a contact opening 308 is formed, a portion of the active material is also removed, as shown in FIG. 15. The uniformity of the IMP process results in a substantially level layer of conductive material 342 at the bottom 352 of the contact opening 308 with very little or no sidewall coverage at the shallow active-device region 350. Thus, when a titanium silicide layer 346 is formed by a high temperature anneal, the titanium silicide layer 346 formed does not form on the sidewall portions 348 of the contact opening, which had little or no conductive material 342 thereon (see FIG. 15), and the titanium silicide layer 346 can extend past the shallow active-device region 350 which causes junction leakage (escape of current from the shallow active-device region) into the underlying substrate material.

Thus, it can be appreciated that it would be advantageous to develop a technique and a contact interface to maximize sidewall coverage of the exposed active-device region while minimizing bottom coverage of the exposed active-device region in a contact opening to form a contact interface for a shallow junction device.

SUMMARY OF THE INVENTION

The present invention relates to altering an IMP process to form a contact interface within a contact opening for a shallow junction device, wherein the contact interface has a substantially continuous profile (substantially annular) along sides of a depression formed in the active surface of the semiconductor substrate, wherein the depression is formed by an etching process to form a contact opening through a dielectric layer. The contact interface is formed by depositing a layer of conductive material, such as titanium, with a high bias power deposition. The conductive material is preferably turned to a silicide by an annealing process, thereby forming the contact interface.

The annular contact interface profile flows current through the contact corners, while the vast majority of the contact will possess a higher resistance. This is advantageous for shallow active-device regions as the silicide will have effective contact with the shallow active-device region, while at the same time there is very little penetration of the silicide downward into the active-device region, thus assisting in reducing or eliminating junction leakage.

In an exemplary method of the present invention, a semiconductor substrate having a contact opening through a dielectric layer to contact an active-device region on the semiconductor substrate, is placed on a pedestal within an IMP deposition chamber. A DC power source, coupled to a conductive material target such as titanium, is preferably set between about 1 and 9 kilowatts and an RF power source is preferably set between about 2 and 3 kilowatts. A pedestal bias power source is set to deliver a relatively high pedestal bias power of greater than about 300 watts which results in a build-up of titanium at corners and lower sidewall portions of the contact opening.

After deposition, the semiconductor substrate is subjected to a high temperature anneal to form a titanium silicide layer. The unreacted titanium layer may be removed (optional) and a contact is completed by depositing a metal or other such conductive material in the contact opening.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

FIGS. 1–6 illustrate various structures and contact interface formations of the present invention. It should be understood that the illustrations are not meant to be actual views of any particular semiconductor device, but are merely idealized representations which are employed to more clearly and fully depict the formation of contact interfaces in the present invention than would otherwise be possible. Additionally, elements common between FIGS. 1–6 retain the same numerical designation.

Although the examples presented are directed to the formation of titanium silicide contact interfaces, any metal or metal alloy which is capable of forming a silicide may be employed.

EXAMPLE

Figure 1:
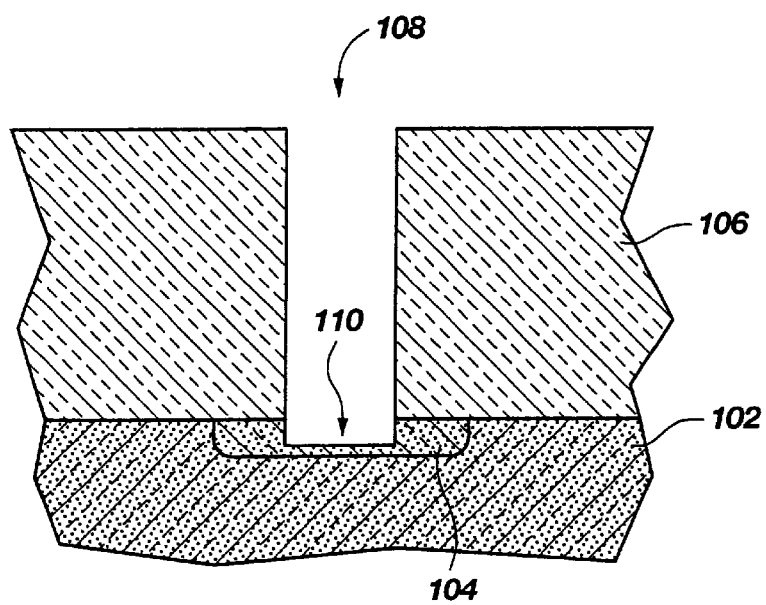
FIG. 1 is a cross-sectional view of a semiconductor substrate having an active-device region implanted therein and a dielectric layer disposed thereover with a contact opening therethrough.

Referring to FIG. 1, a test semiconductor substrate 102 (i.e., a silicon wafer) was formed with an active-device region 104 implanted therein and at least one dielectric layer 106 disposed thereover. At least one contact opening 108 (having a diameter of 0.35 $\mu$m and an aspect ratio greater than 4 to 1) was formed through the dielectric layer 106, by a known patterning and etching technique, to expose the active-device region 104, which also results in a recess 110 into the active-device region 104 caused by the etching technique.

Figure 2:
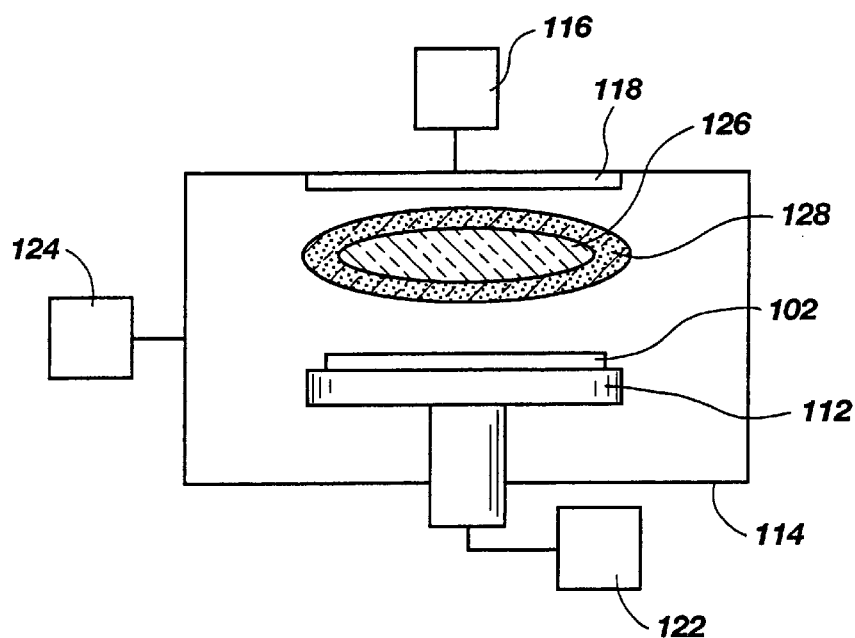
FIG. 2 is a schematic of an IMP system.
Figure 12:
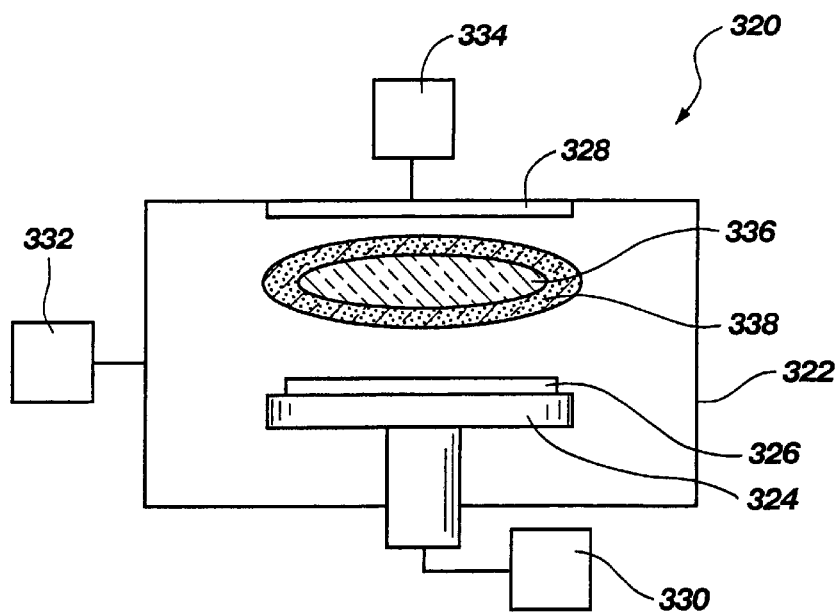
FIG. 12 is a schematic of an IMP system.
Figure 13:
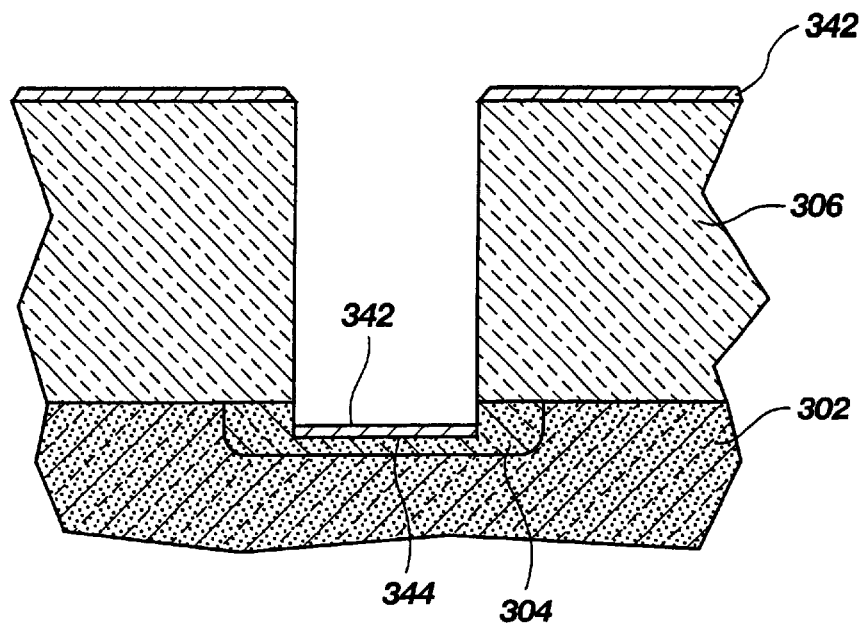
FIG. 13 is a cross-sectional view of a titanium layer formed by an IMP system.
Figure 14:
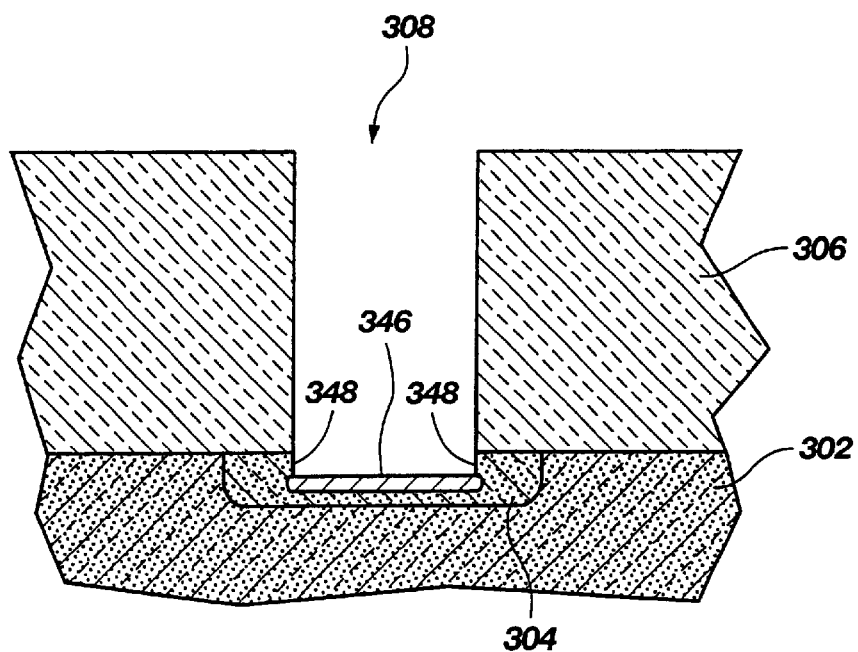
FIG. 14 is a cross-sectional view of the titanium layer having been formed into a titanium silicide layer by an annealing process.
Figure 15:
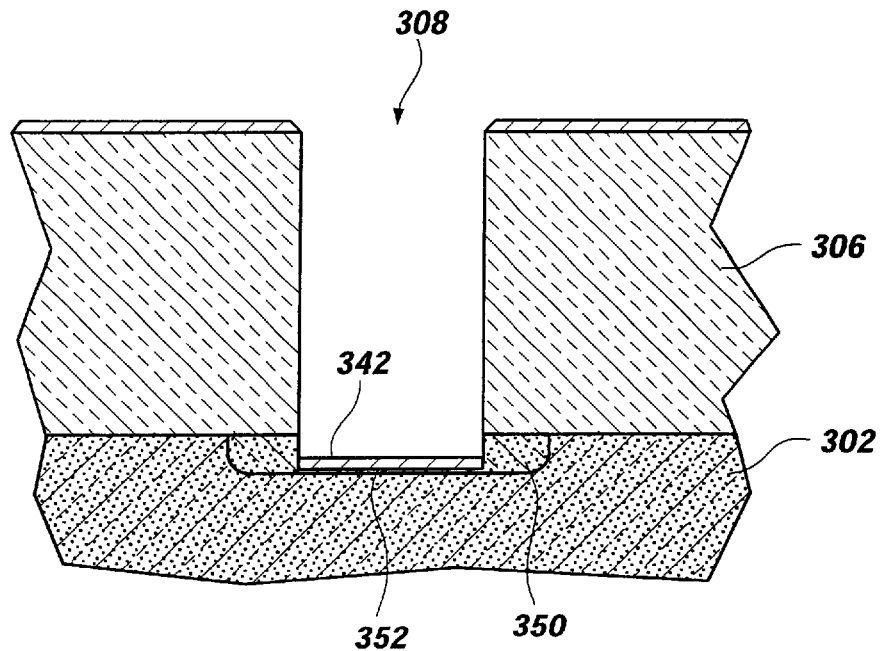
FIG. 15 is a cross-sectional view of a titanium layer formed by an IMP system in a shallow active-device region.
Figure 16:
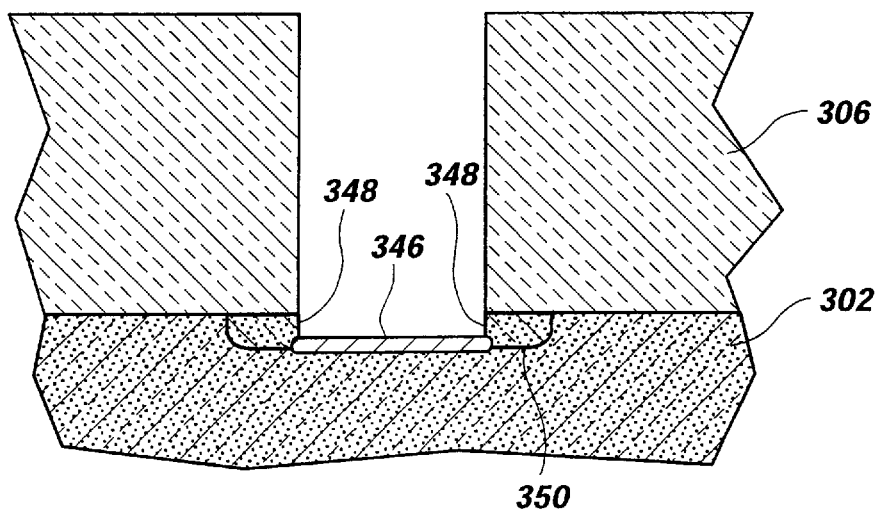
FIG. 16 is a cross-sectional view of the titanium layer having been formed into a titanium silicide layer by an annealing process in a shallow active-device region.

As shown in FIG. 2, the test semiconductor substrate 102 was placed on a pedestal 112 within an IMP deposition chamber 114 (as also illustrated in FIG. 12). Preferably, the test semiconductor substrate 102 was placed in a hydrofluoric acid dip (prior to placement in the IMP deposition chamber 114) in order to remove native oxides from the contact opening 108. It is known that thin layers of native oxide will grow immediately after the removal of the test semiconductor substrate 102; however, the hydrofluoric acid dip will remove any previously formed native oxides or build-up thereof.

A DC power source 116, coupled to a titanium target 118, was set at approximately 2.0 kilowatts and an RF power source 124 was set at approximately 2.1 kilowatts. A pedestal bias power generated from a pedestal bias power source 122, coupled to the pedestal 112, was varied from about 150 watts to about 500 watts, as will be discussed. The IMP deposition chamber 114 was maintained at temperature of about 200° C.

As particles of titanium (not shown) are sputtered from the titanium target 118, they are ionized to a positive charge while residing in a plasma 126 formed between the titanium target 118 and the semiconductor substrate 102. Thus, any negative voltage on the pedestal 112 will accelerate the titanium ions toward the pedestal 112. These titanium ions strike the semiconductor substrate 102 atop the pedestal 112, forming a titanium layer. A self-bias voltage of approximately –20 volts will be inherently present on the pedestal 112 at these operating parameters, even with no pedestal bias power applied. As the pedestal bias power is increased, an increasing pedestal bias voltage will be present, reaching a potential of approximately –80 volts for an applied pedestal bias power of about 300 watts.

Figure 3:
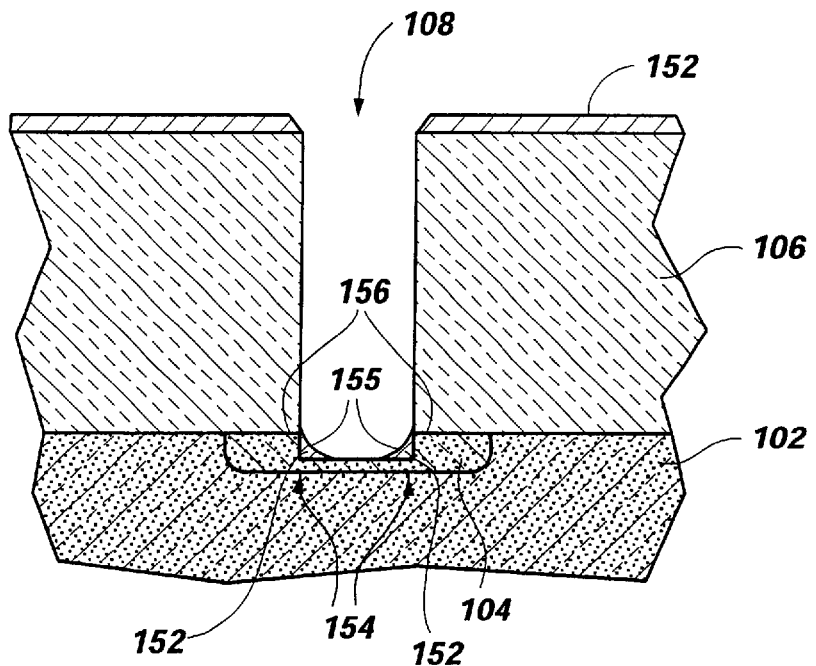
FIG. 3 is a cross-sectional view of a titanium layer formed in an IMP system with a high pedestal bias power.

FIG. 3 illustrates a titanium layer formed with a high bias power. It has been found that with a relatively high pedestal bias power of greater than about 300 watts, there is a high acceleration of the ionized titanium particles from the sheath 128 of the plasma 126 (see FIG. 2). The high acceleration causes resputtering of a previously deposited titanium layer. This results in a build-up of titanium 152 at corners 154 and a lower sidewall portion 156 of the contact opening 108. For example in a circular contact opening, the titanium build-up 152 would be annular in shape, having an inclined, concave, and inwardly facing upper suface 155. This deposition is preferably perform at a temperature of between 0° and 300° C., a pressure of about 15 $\mu$Torr and 30 $\mu$Torr, and a duration between about 35 and 70 seconds.

Figure 4:
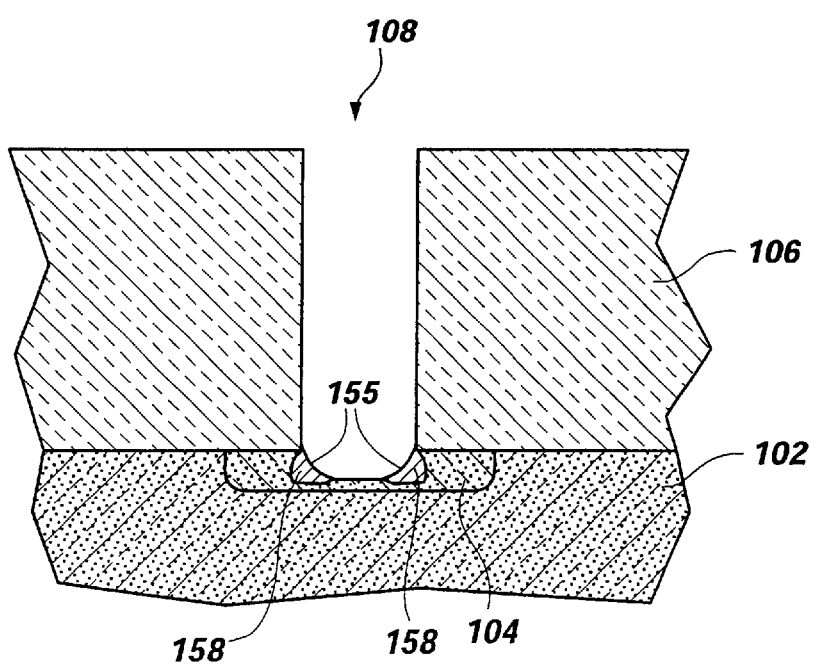
FIG. 4 is a cross-sectional view of a titanium silicide layer formed from the titanium layer of FIG. 3.

When a titanium silicide layer 158 is formed by heating the semiconductor substrate 102, such as by rapid thermal processing (RTP), as shown in FIG. 4, the titanium silicide layer 158 allows a very limited contact area. For devices which do not have shallow junctions, such a limited contact area is detrimental because high contact resistance would result as the majority of the current follows the path of least resistance through the titanium silicide layer 158. However, for a shallow junction device, such an annular titanium silicide layer 158 forms an effective contact with the shallow active-device region 104, while at the same time there is no penetration of the titanium silicide layer 158 downward past the active-device region 104, thus assisting in reducing or eliminating junction leakage of current into the underlying semiconductor substrate 102.

Figure 5:
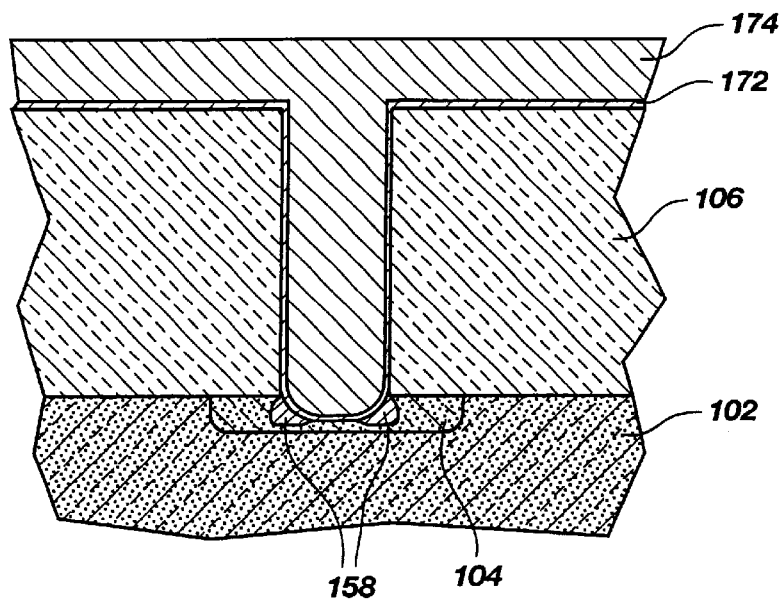
FIG. 5 is a cross-sectional view of a contact formed over the contact interface formed in the method illustrated in FIGS. 3–4.

Additionally, to complete the fabrication of a contact, as shown in FIG. 5, a layer of titanium nitride 172 is deposited over the dielectric layer 106 and into the contact opening 108. The contact opening 108 is then filled with a conductive material 174, such as tungsten.

Figure 6:
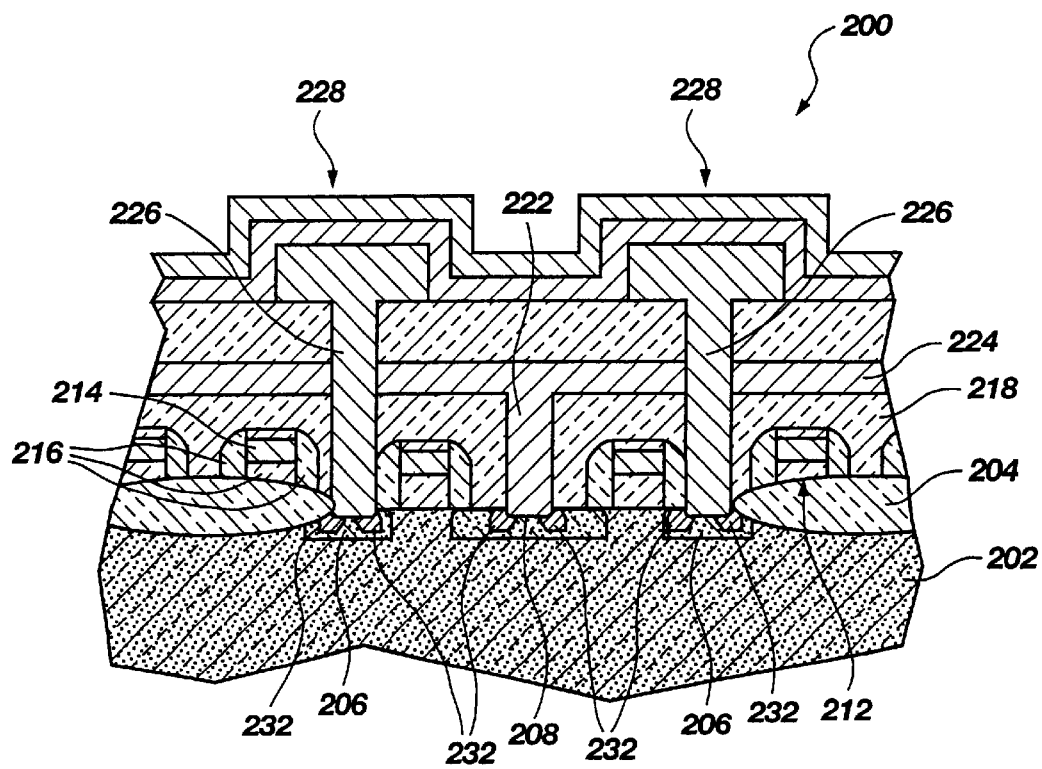
FIG. 6 is a cross-sectional view of a memory array of a DRAM chip utilizing the contact interfaces of the present invention.
Figure 7:
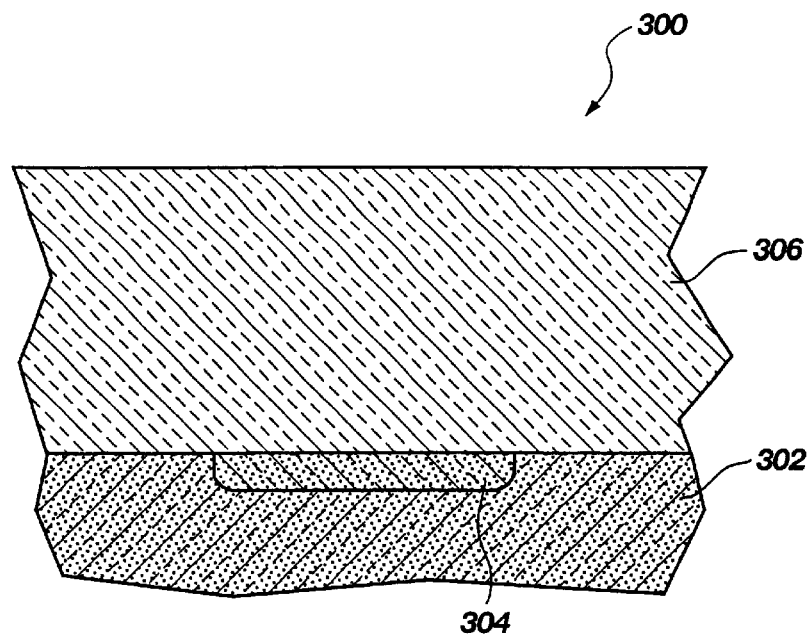
FIGS. 7–11 are cross-sectional views of a prior art method of forming a titanium silicide layer in a contact opening.
Figure 8:
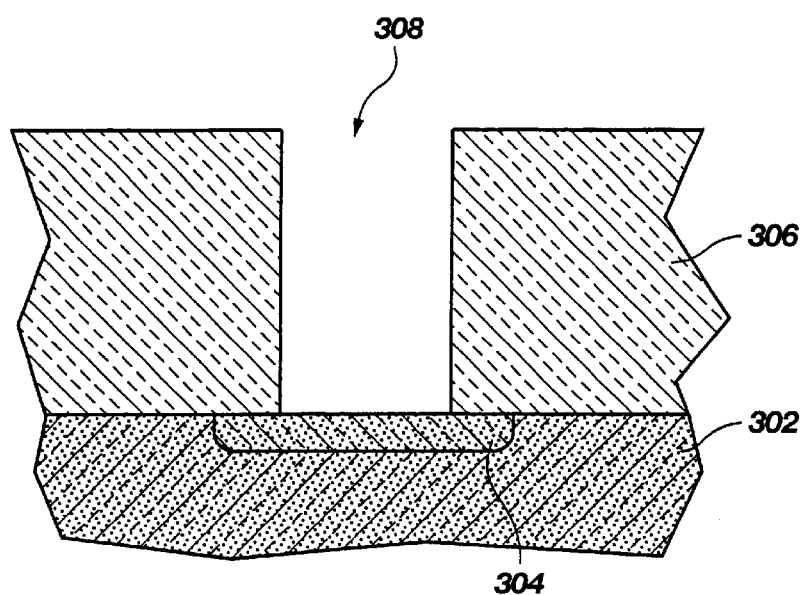
Figure 9:
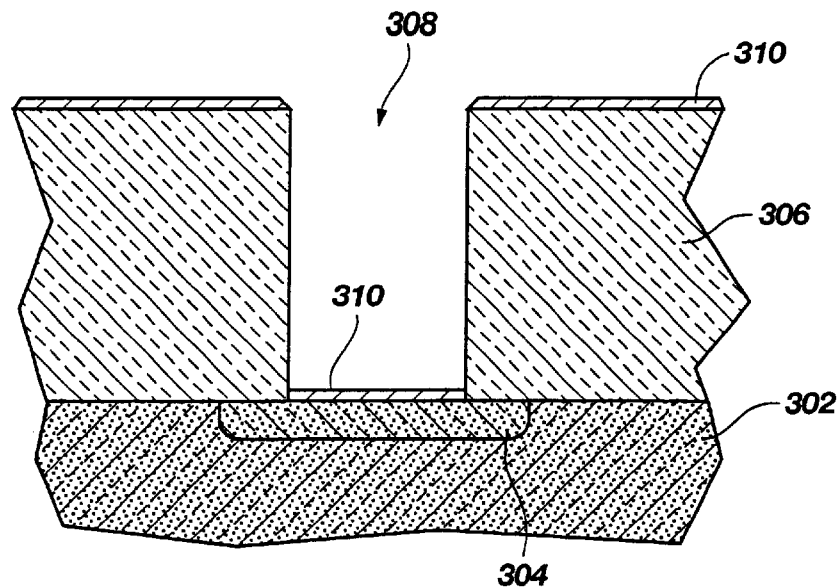
Figure 10:
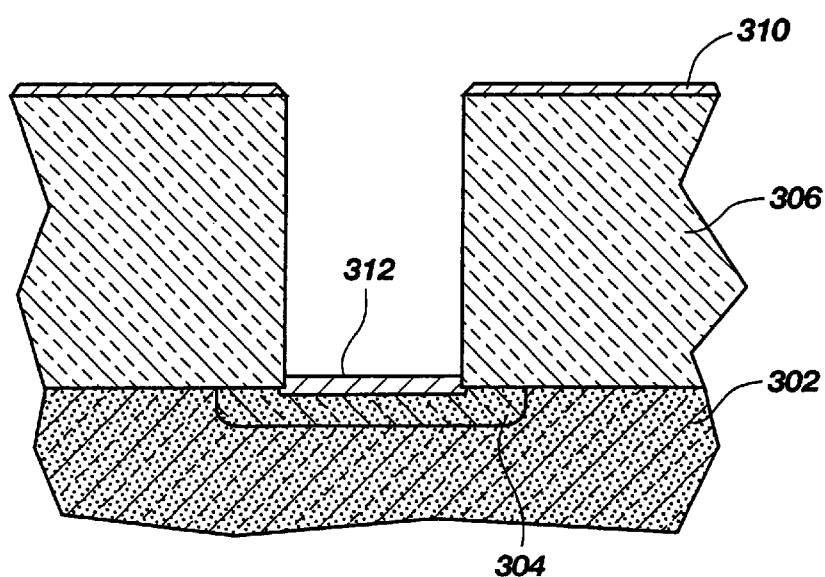
Figure 11:
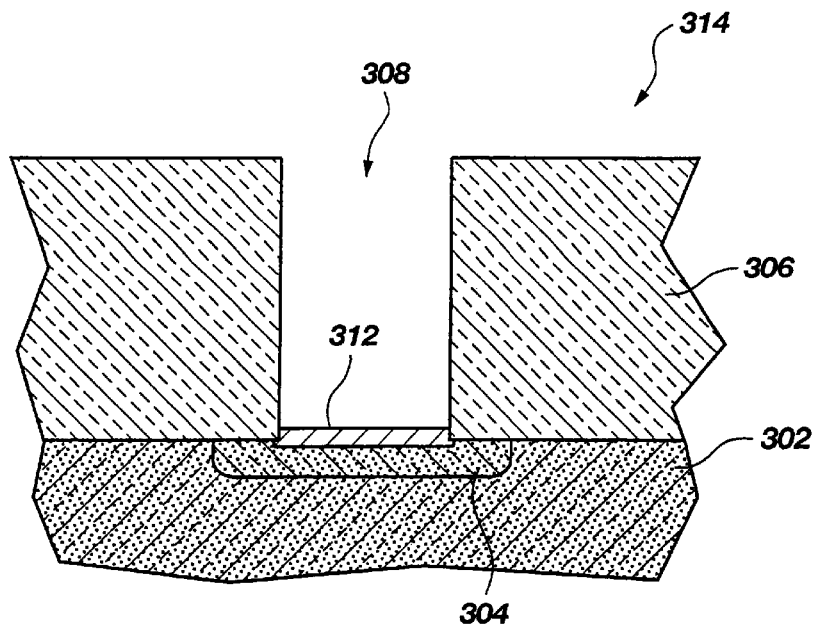

Furthermore, it is contemplated that the process of the present invention is useful for production of DRAM chips, wherein the contact interfaces are used in the CMOS structures within a memory array of a DRAM chip. Such a CMOS structure 200 is illustrated in FIG. 6, as a portion of a memory array in a DRAM chip. The CMOS structure 200 comprises a semiconductor substrate 202, such as a lightly doped P-type crystal silicon substrate, which has been oxidized to form thick field oxide areas 204 and exposed to implantation processes to form drain regions 206 and source regions 208. Transistor gate members 212, including a word line 214 bounded by insulative material 216, are formed on the surface of the semiconductor substrate 202. A barrier layer 218 is disposed over the semiconductor substrate 202, the thick field oxide areas 204, and the transistor gate members 212. The barrier layer 218 has bitline contacts 222 contacting the source regions 208 for electrical communication with a bitline 224, and, further, has capacitor contacts 226 contacting the drain regions 206 for electrical communication with capacitors 228. Each of the bitline contacts 222 and capacitor contacts 226 may have silicide layer interfaces 232 formed as described above for reducing resistance between the bitline contacts 222 and the source regions 208, and between the capacitor contacts 226 and the drain regions 206.

An additional advantage of the present invention is an enhanced protection against defects associated with $WF_6$. When $WF_6$ is deposited in a contact opening, it migrates into the silicon, creating long voids or "wormholes" in the substrate through the junction. This occurs particularly at the corners of the contact opening. The presence of the silicide in the corners of the contact opening, as taught by the present application, minimizes or prevents this from happening.

A further advantage of the present invention is that it can also be used for making electrical contact with unlanded structures and can be used for forming a contact through the conductive layer, such as conductive polysilicon layers.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A contact interface residing in a high aspect ratio contact opening, wherein said high aspect ratio contact opening comprises at least one substantially vertical side wall intersecting a bottom surface, the intersection of the at least one substantially vertical side wall and the bottom surface forming a corner recessed within an active-device region, and wherein said contact interface comprises a substantially ring-shaped structure of silicide material, said substantially ring-shaped structure of silicide material having an inclined, concave, and inwardly facing upper surface and being disposed in the corner recessed within said active-device region such that a center area of the bottom surface of the high aspect ratio contact opening remains free of silicide material.

2. The contact interface of claim 1, wherein said substantially ring-shaped structure of silicide material comprises titanium silicide.

3. The contact interface of claim 1, wherein said high aspect ratio contact opening includes a contact opening having an aspect ratio of greater than 4 to 1.

4. A contact interface residing in a high aspect ratio contact opening, wherein said high aspect ratio contact opening comprises at least one substantially vertical side wall intersecting a bottom surface, the intersection of the at least one substantially vertical side wall and the bottom surface forming a corner recessed within an active device region, and wherein said contact interface comprises a substantially ring-shaped structure of silicide material, said substantially ring-shaped structure of silicide material having an inclined, concave, and inwardly facing upper surface and being disposed in the corner recessed within said active-device region such that a center area of the bottom surface of the high aspect ratio contact opening remains free of silicide material, said contact interface formed by a method comprising:

depositing said substantially ring-shaped structure of silicide material in said high aspect ratio contact opening with an IMP process at a high pedestal power.

5. The contact interface of claim 4, wherein said high aspect ratio contact opening includes a contact opening having an aspect ratio of greater than 4 to 1.

6. A contact residing in a high aspect ratio contact opening, wherein said high aspect ratio contact opening comprises at least one substantially vertical side wall intersecting a bottom surface, the intersection of the at least one substantially vertical side wall and the bottom surface forming a corner recessed within an active-device region, and wherein said contact interface comprises a contact interface comprising a substantially ring-shaped structure of silicide material, said substantially ring-shaped structure of silicide material having an inclined, concave, and inwardly facing upper surface and being disposed in the corner recessed within said active-device region such that a center area of the bottom surface of the high aspect ratio contact opening remains free of silicide material, said contact formed by a method comprising:

providing a silicon-containing semiconductor substrate having a dielectric layer thereover, wherein at least one high aspect ratio contact opening extends through said dielectric layer and into at least one active-device region in said silicon-containing semiconductor substrate, forming a recess within said at least one active-device region;

depositing a first conductive material in said at least one high aspect ratio contact opening with an IMP process at a high pedestal bias power;

annealing said silicon-containing semiconductor substrate to react said first conductive material with said at least one active-device region to form said silicide material;

removing a non-reacted portion of said first conductive material; and depositing a second conductive material in said at least one high aspect ratio contact opening.

7. The contact of claim 6, wherein said high aspect ratio contact opening includes a contact opening having an aspect ratio of greater than 4 to 1.

8. A DRAM chip, having at least one contact interface residing in a high aspect ratio contact opening, wherein said high aspect ratio contact opening comprises at least one substantially vertical side wall intersecting a bottom surface, the intersection of the at least one substantially vertical side wall and the bottom surface forming a corner recessed within an active-device region, and wherein said contact interface comprises a substantially ring-shaped structure of silicide material, said substantially ring-shaped structure of silicide material having an inclined, concave, and inwardly facing upper surface and being disposed in the corner recessed within said active-device region such that a center area of the bottom surface of the high aspect ratio contact opening remains free of silicide material, said DRAM chip formed by a method comprising:

providing a silicon-containing semiconductor substrate having a dielectric layer thereover, wherein at least one high aspect ratio contact opening extends through said dielectric layer and into at least one active-device region in said silicon-containing semiconductor substrate, forming a recess within said at least one active-device region;

depositing a first conductive material in contact with said at least one active-device region within said at least one high aspect ratio contact opening by an IMP process at a high pedestal bias power;

annealing said silicon-containing semiconductor substrate to react said first conductive material to form said silicide material;

removing a non-reacted portion of said first conductive material; and depositing a second conductive material in said at least one high aspect ratio contact opening.

9. The DRAM chip of claim 8, wherein said high aspect ratio contact opening includes a contact opening having an aspect ratio of greater than 4 to 1.

10. A contact comprising:

a high aspect ratio contact opening comprising at least one substantially vertical side wall intersecting a bottom surface, the intersection of the at least one substantially vertical side wall and the bottom surface forming a corner recessed within an active-device region;

a contact interface comprising a substantially ring-shaped structure of a first conductive material, said substantially ring-shaped structure comprising a silicide material, having an inclined, concave, and inwardly facing upper surface and being disposed in the corner recessed within said active-device region such that a center area of the bottom surface of the high aspect ratio contact opening remains free of said first conductive material; and a second conductive material deposited over said substantially ring-shaped structure and within said high aspect ratio contact opening.

11. The contact of claim 10 wherein said second conductive material comprises a metal nitride.

12. The contact of claim 10 further comprising a third conductive material deposited over said second conductive material.

13. The contact of claim 12 wherein said third conductive material comprises a metal.

14. A memory chip including:

a high aspect ratio contact opening comprising at least one substantially vertical side wall intersecting a bottom surface, the intersection of the at least one substantially vertical side wall and the bottom surface forming a corner recessed within an active-device region; and a contact interface comprising a substantially ring-shaped structure of a first conductive material, said substantially ring-shaped structure comprising a silicide material, having an inclined, concave, and inwardly facing upper surface and being disposed in the corner recessed within said active-device region such that a center area of the bottom surface of the high aspect ratio contact opening remains free of said first conductive material.

15. The memory chip of claim 14, further including a second conductive material deposited over said substantially ring-shaped structure of said first conductive material and within said high aspect ratio contact opening.

16. The memory chip of claim 15, further including a third conductive material deposited over said second conductive material.

17. The memory chip of claim 16, wherein said second conductive material comprises a metal nitride and said third conductive material comprises a metal.

* * * * *